United States Patent [19]

Vittoria

[11] Patent Number: 4,506,234
[45] Date of Patent: Mar. 19, 1985

[54] AMPLITUDE AND PHASE MODULATION IN FIN-LINES BY ELECTRICAL TUNING

[75] Inventor: Carmine Vittoria, Bowie, Md.

[73] Assignee: The United States of America as represented by the Secretary of the Navy, Washington, D.C.

[21] Appl. No.: 505,569

[22] Filed: Jun. 17, 1983

[51] Int. Cl.$^3$ .............................................. H03C 7/02
[52] U.S. Cl. ................................... 332/16 R; 332/17; 332/29 R; 333/24.1; 333/158; 333/248; 455/111
[58] Field of Search .................... 332/16 R, 17, 29 R, 332/51 R, 51 W, 52, 68; 333/24.1, 158, 248, 263, 253; 455/111

[56] References Cited

U.S. PATENT DOCUMENTS

| | | | |
|---|---|---|---|
| 3,069,680 | 12/1962 | Seeley et al. | 343/768 |
| 3,100,288 | 8/1963 | Schloemann | 333/24.2 |
| 3,425,001 | 1/1969 | Hershenov | 333/1.1 |
| 3,521,196 | 7/1970 | Alfandari et al. | |
| 3,602,845 | 8/1971 | Agrios | 333/24.1 |
| 3,629,737 | 12/1971 | Wen | 333/24.1 |
| 3,715,692 | 2/1973 | Reuss, Jr. | 333/24.1 |
| 3,886,501 | 5/1975 | Lavedan, Jr. | 333/24.1 |
| 3,973,225 | 8/1976 | Hines | 333/24.1 |
| 4,001,733 | 1/1977 | Birch et al. | 333/24.1 |
| 4,186,357 | 1/1980 | Forterre et al. | 333/24.1 |
| 4,188,594 | 2/1980 | Bongianni | 332/16 R |
| 4,201,961 | 5/1980 | Klein | 333/24.1 |
| 4,301,430 | 11/1981 | Stachejko | 333/24.1 |
| 4,353,042 | 10/1982 | D'Oro et al. | 333/24.1 |

OTHER PUBLICATIONS

C. Vittoria, "Ferrite Uses at Millimeter Wavelengths", Journal of Magnetism and Magnetic Materials, 71, (1980), pp. 109–118.
G. T. Rado et al., "Linear Electric Field Shift of a Ferromagnetic Resonance: Lithium Ferrite", Physical Review Letters, vol. 41, No. 18, Oct. 30, 1978, pp. 1253–1255.
A. M. K. Saad et al., "Electrical Performance of Fin-lines of Various Configurations", IEE Journal of Microwaves, Optics and Acoustics, Great Britain, vol. 1, No. 2, Jan. 1977, pp. 80–88.
P. J. Meier, "Integrated Fin-Line Millimeter Components", IEEE Transactions on Microwave Theory and Techniques, vol. MTT-22, No. 2, Dec. 1974, pp. 1209–1216.
P. J. Meier, "Equivalent Relative Permittivity and Unloaded Q Factor of Integrated Finline", Electronic Letters, vol. 9, No. 7, Apr. 5, 1973, pp. 162–163.
P. H. Vartanian et al., "Propagation in Dielectric Slab Loaded Rectangular Waveguide", IRE Transactions on Microwave Theory and Techniques, vol. MTT-6, 1958, pp. 215–222.

Primary Examiner—Siegfried H. Grimm
Attorney, Agent, or Firm—Robert F. Beers; William T. Ellis; John L. Forrest

[57] ABSTRACT

A fin-line waveguide device for modulating signals passing therethrough. The device comprises a fin-line waveguide including two channel members longitudinally extending in the direction of signal propagation through the device. The channel members are physically and electrically separated by a ferrite dielectric slab which is oriented in a longitudinally extending plane parallel to the electric field lines of the signal passing through the device. A magnetic field is applied to the ferrite slab to magnetically bias the slab to ferromagnetic resonance. A voltage is applied across the ferrite slab to alter the ferromagnetic resonance characteristics of the slab. The phase and amplitude of the signal passing through the waveguide are modulated in response to the applied voltage.

18 Claims, 1 Drawing Figure

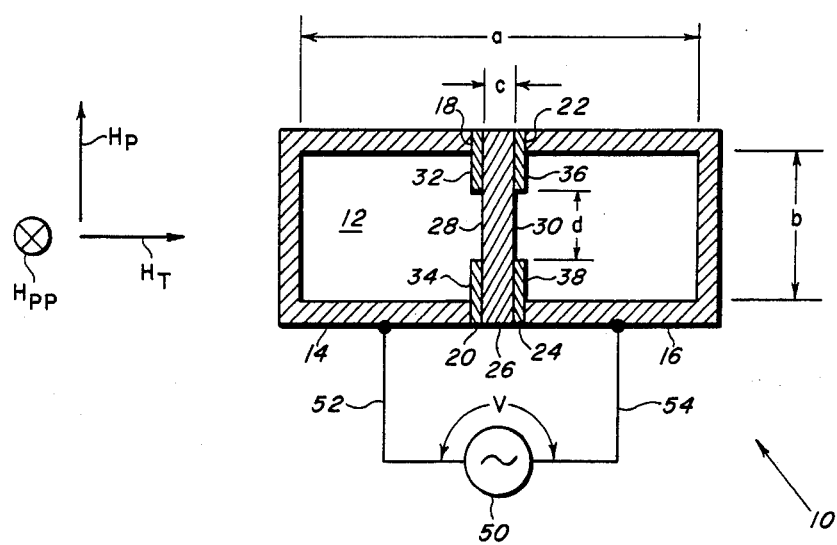

AMPLITUDE AND PHASE MODULATION IN FIN-LINES BY ELECTRICAL TUNING

BACKGROUND OF THE INVENTION

The present Invention relates, in general, to a novel device for modulating the amplitude and phase of millimeter wavelength signals and, more particularly, to a novel device for modulating the amplitude and phase of millimeter wavelength signals in a fin-line waveguide configuration.

Recently there has been a dramatic interest in the development of millimeter wavelength components and, in particular, in non-reciprocal components. Fabrication cost, propagation losses, and device efficiency are all important criteria to be considered at millimeter wavelengths. Presently the fin-line waveguide configuration is believed to offer the best opportunity in meeting all of the above criteria.

The fin-line waveguide configuration is a relatively new type of waveguide transmission line which, in addition to the above mentioned criteria, offers distinct advantages in power handling capacity and bandwidth as compared to conventional waveguides. In its most basic form, the fin-line comprises a rectangular waveguide loaded with a slab of dielectric material positioned across the center of the waveguide in the plane of the electric field. The dielectric slab has the effect of adding capacitance to the dominant mode of resonance while only slightly changing the capacitance associated with adjacent modes. Thus the dielectric slab effectively increases the separation between the first two modes of propogation thereby providing a wider useful bandwidth than conventional waveguides. Additionally, because the dielectric slab has an inherently high breakdown strength relative to air, the slab adds a material having high breakdown strength to the waveguide in a region where breakdown is more likely to occur. As a result, the power handling capability is increased in the fin-line waveguide as compared to conventional waveguides. A thorough description of fin-line waveguides appears in P. J. Meier, "Integrated Fin-Line Millimeter Components," IEEE Transactions on Microwave Theory and Techniques, Vol. MTT-22, No. 12, December 1974, pages 1209-1216. The contents of this article are incorporated herein by reference.

The present Invention provides a novel means for modulating the phase and amplitude of millimeter wavelength signals passing through a fin-line waveguide.

SUMMARY OF THE INVENTION

Accordingly, one object of the present Invention is to provide a novel apparatus for modulating millimeter wavelength signals.

Another object is to provide a novel low cost device for modulating millimeter wavelength signals.

These and other objectives and advantages are provided by a novel fin-line waveguide device for modulating an electromagnetic signal passing therethrough which comprises a waveguide including first and second channel members longitudinally extending in the direction of signal propagation through the device. A ferrite dielectric slab is disposed in the waveguide between the first and second channel members to longitudinally bisect the waveguide and to electrically separate the first and second channel members. The ferrite slab is located in a longitudinally extending plane parallel to the electric field lines of the signal passing through the waveguide. A means produces a magnetic field in the ferrite slab to magnetically bias the ferrite slab to or near ferromagnetic resonance. A voltage is applied across the ferrite slab to shift the ferromagnetic resonance characteristics of the ferrite slab. Thus, the magnetic permeability of the ferrite slab is altered upon the application of the voltage across the slab. Since the phase and amplitude of the electromagnetic signal propagating through the fin-line waveguide depends on the permeability and dielectric constant of the ferrite slab, the device thus modulates the phase angle of the signal passing therethrough in response to the applied voltage.

BRIEF DESCRIPTION OF THE DRAWING

A more complete appreciation of the Invention and many of the attendant advantages thereof will be readily obtained as the same becomes better understood by reference to the following detailed description when considered in connection with the accompanying sole drawing FIGURE, wherein a preferred embodiment of a fin-line modulator device according to the present Invention is illustrated in cross-section.

DETAIL DESCRIPTION OF THE PREFERED EMBODIMENTS

Referring now to the drawing, a fin-line modulator device 10 is illustrated in cross-section. The modulator 10 includes a rectangular waveguide 12 formed from two channel members 14 and 16. The channel members 14 and 16 are formed from standard non-magnetic waveguide materials, such as copper, silver, brass, etc. The channel member 14 includes two edge surfaces 18 and 20 while the channel member 16 includes two edge surfaces 22 and 24. The channel members 14 and 16 are oriented such that their respective edge surfaces 18, 20 and 22, 24 oppose each other.

Positioned between the respective edges of the channel members 14 and 16 is a slab or panel of ferrite dielectric material 26, having a thickness "c", the characteristics of which will be described in detail below. The ferrite slab 26 includes a first side surface 28 and a second side surface 30. The first side surface 28 is coated with metallic layers 32 and 34 spaced apart by a distance "d" while the second side surface is coated with metallic layers 36 and 38 spaced apart by the distance d. The metallic layers 34 through 38 are thus positioned so as to expose an area having a width d on each of the side surfaces 28 and 30. The metallic layers 34 through 38 are comprised of the same non-magnetic material as that of the channel members 14 and 16 and are formed on the ferrite slab 26 by any standard means, such as by vapor deposition or evaporation. The metallic layers should have a thickness greater than the skin depth penetrated by the electromagnetic wave to be carried by the fin-line waveguide. A typical layer thickness would be approximately 5 $\mu$m or greater for frequencies in the range of 1 to 100 GHz.

The modulator device 10 is assembled such that the edge surfaces 18, 20, 22, and 24 of the the channel members 14 and 16 are in firm mechanical and electrical contact with the respective metallic layers 32, 34, 36, and 38. Thus, the channel member 14 is in electrical contact with the side surface 28 while the channel member 16 is in electrical contact with the side surface 30 of the ferrite slab 26. The assembled waveguide 12 has an overall internal width "a" and an internal height "b".

The ferrite slab 26 thus spans the height b of the waveguide 12 and, therefore, is positioned in parallel with the direction of the electric field developed within the waveguide 12 by the transmitted wave.

The fin-line waveguide wavelength λg is given by:

$$\lambda g = \lambda_o [K_e - (\lambda_o/\lambda_c)^2]^{-\frac{1}{2}} \quad (1)$$

where $K_e$ is the effective dielectric constant of the ferrite slab which includes the permeability as well as the actual dielectric constant of the ferrite slab. $\lambda_o$ is the free space wavelength and $\lambda_c$ is the cut-off wavelength which can be calculated for given dimensions a, b, and d as described in the above-mention article by P. J. MEIER, incorporated herein by reference. For example, for a=0.71 cm, b=0.35 cm, and d=0.035 cm the cut-off wavelength $\lambda_c$ will be 2.148 cm. If the effective dielectric constant $K_e$ is assumed to be approximately 3 for a typical ferrite material, the waveguide wavelength λg from Equation (1) for a free space wavelength $\lambda_o$ of 0.86 cm (35 GHz) is 0.51 cm. Typically, the thickness of the ferrite slab c can be 250 μm or less for the above stated values of a, b, and d. As a rule, the dimensions a, b, c, and d will be smaller for higher frequencies of operation. Additional fin-line design equations and dimension graphs are presented in P. H. Vartanian et al., "Propagation in Dielectric Slab Loaded Rectangular Waveguide", IRE Transactions on Microwave Theory and Techniques, Vol. MTT-6, 1958, pages 215–222, and in A. M. K. Saad et al., "Electrical Performance of Finlines of Various Configurations", IEE Journal of Microwave, Optics, and Acoustics, Great Britain, Vol. 1, No. 2, January 1977, pages 81–88. The contents of these articles are incorporated herein by reference.

Although not illustrated, it should be understood that the fin-line modulator 10 has a length "L". The length L should be equal in length to at least one wavelength of the transmitted wave. A length of 2 cm would be sufficient for waves in the range of 30 to 50 GHz.

The ferrite material used to form the ferrite panel 26 can be any material which exhibits a magnetoelectric effect at any temperature. The magnetoelectric effect manifests itself in ferrite materials which have no center of inversion symmetry or in ferrites with very low symmetry. The magnetoelectric effect is usually observed at low temperatures on the order of 4.2° Kelvin. However, in flux grown single crystal lithium ferrite ($Li_2Fe_3O_4$) the magnetoelectric effect is observed as high as 150° Kelvin. In the case of lithium ferrite, an appropriate ferrite slab can be obtained from a bulk of single crystal lithium ferrite material flux grown from lead rich melt. In such a bulk, the skin region closest to the growth flux exhibits the highest level of magnetoelectric effect. Therefore, the ferrite slab 26 should be prepared from a layer of this skin material. Skin layer lithium ferrite sheets may be readily obtained from ferrite manufacturers such as Allied Corporation. Other ferrite materials exhibiting the magnetoelectric effect can also be used, as should be apparent to those of skill in the art.

Provision must be made to maintain the ferrite slab 26 at an appropriate temperature consistant with the magnetic characteristics of the particular ferrite material used. In the case of lithium ferrite, the slab 26 must be cooled to a temperature of approximately 150° Kelvin. This can be readily accomplished by enclosing the entire fin-line modulator 10 in a suitable non-magnetic vessel (not illustrated) filled with liquid nitrogen or liquid argon, or by equivalent well-known cooling means. Other ferrite materials will require similar cooling temperature considerations, as should be apparent to those of skill in the art.

In general, the equivalent dielectric constant $K_e$ of a ferrite slab in a fin-line structure is not a strong function of the waveguide dimensions. The effective dielectric constant is, however, a function of the material magnetic parameters of the actual dielectric ferrite material used. Thus by changing the material parameters of the dielectric material, the effective dielectric constant $K_e$ may be changed. From equation (1), a change in the dielectric constant $K_e$ results in a change in the waveguide wavelength λg of the fin-line which has the effect of imparting a change in phase of the signal transmitted by the fin-line waveguide.

In the fin-line modulator device 10 of the present Invention, modulation of signals traveling through the device 10 is accomplished in a manner similar to that described above with respect to equation (1) by altering or modulating the magnetic parameters of the ferrite dielectric slab 26. The magnetic parameters of the ferrite are altered or modulated by applying a variable voltage across the ferrite slab in the presence of a fixed DC magnetic field. The fixed magnetic field acts to magnetically bias the ferrite slab to or near ferromagnetic resonance for the particular ferrite material utilized. Applying a voltage across the ferrite slab results in a shift in the absorption or dispersion curve for the ferrite material which is linearly proportional to the amplitude of the applied voltage. The ferromagnetic resonance characteristics of a particular ferrite material, in particular, thin surface skin lithium ferrite, in the presence of both magnetic and electric fields are discussed in G. T. Rado et al., "Linear Electric Field Shift of a Ferromagnetic Resonance: Lithium Ferrite", Physical Review Letters, Vol. 41, NO. 18, 30 October 1978, pages 1253–1255. The contents of this article are incorporated herein by reference.

Referring again to the drawing, the magnetizing force vector H of the fixed DC magnetic field may be applied to the fin-line modulator device 10 parallel to the plane of the ferrite slab 26 as indicated by the vector $H_p$ or by applying the vector perpendicular to the plane of the slab 26, as indicated by the vector $H_T$. The magnetic field may be supplied by appropriately orienting the device 10 within the air gap of a permanent horseshoe-type magnet (not illustrated) or by positioning the device 10 within an electromagnet solenoid (not illustrated) or within a Helmholtz coil (not illustrated).

The ferromagnetic resonant frequency ω for ferrite materials is related to the magnitude of the parallel field vector $H_p$ by:

$$\omega = \gamma [H_p(H_p + 4\pi M)]^{\frac{1}{2}} \quad (2)$$

where $\gamma = ge/2mc$, g is the gyromagnetic splitting factor, e is the electron charge, m is the electron mass, c is the velocity of light, and M is the saturation magnetization for the particular ferrite material used. Similarly, the ferromagnetic resonant frequency ω is related to the magnitude of the perpendicular field vector $H_T$ by:

$$\omega = \gamma [H_T - 4\pi M] \quad (3)$$

For lithium ferrite, γ is equal to 2.8 MHz/Gauss while the quantity 4πM equals 4000 Gauss.

A voltage source 50 produces a voltage V across two conductors 52 and 54. The conductor 52 is electrically coupled to the first channel member 14 while the conductor 54 is electrically coupled to the second channel member 16. As previously described, the first channel member 14 is electrically coupled to the first side surface 28 of the ferrite slab 26 through the metallic layers 32 and 34 while the second channel member 16 is electrically coupled to the second side surface 30 of the ferrite slab 26 through the metallic layers 36 and 38. Thus, due to the dielectric characteristics of the ferrite material, essentially the entire voltage V appears across the ferrite slab 26.

The frequency of the voltage V may range from DC up to 100 MHz or higher, the upper limit being controlled by the relaxation time constant of the ferrite material. The maximum amplitude of the voltage V is limited by the dielectric breakdown strength of the ferrite material.

The fin-line modulator device 10 may be used to simultaneously amplitude and phase modulate a signal passing through the device. When used for this purpose, the bias magnetic field strength ($H_p$ or $H_T$) should be set according to Equations (2) or (3) to produce resonance in the ferrite slab 26 at the frequency of the signal to be transmitted by the device. For example, for lithium ferrite material a parallel field $H_P$ of 3000 Gauss will produce resonance at 12.8 GHz. The amplitude and phase of the transmitted signal can be varied or modulated by varying the amplitude of the applied voltage V. The rate of change in the amplitude and phase of the transmitted signal is proportional to the frequency of the applied voltage V.

In many circumstances phase modulation with no change in amplitude is desired. Phase modulation with little or no amplitude variation can be achieved with the device 10 by magnetically biasing the ferrite slab 26 to a ferromagnetic resonant frequency, as given by Equations (2) or (3), which is at least 10 times the absorption bandwidth (FMR linewidth) of the particular ferrite material used away from the frequency of the transmitted signal. The resonant frequency may be either above or below the signal frequency. For example, lithium ferrite material has an absorption bandwidth of 2 Gauss or approximately 6 MHz. Thus, the resonant frequency should equal the signal frequency plus or minus 0.06 GHz. The phase of the transmitted signal will be altered in proportion to the amplitude of the applied voltage V. For example, a lithium ferrite slab 125 μm thick in a bias field of 3000 Gauss will linearly shift the phase of a 12.74 GHz transmitted signal at the rate of 1 degree per 100 volts applied voltage.

It should be noted that the ratio of the phase shift to the applied voltage is inversely proportional to the thickness c of the ferrite slab 26. Thus reducing the thickness c will increase the change in phase for a given voltage change. The minimum useable thickness of the ferrite slab 26 is controlled by the maximum applied voltage and the dielectric breakdown strength of the ferrite material used.

The fin-line modulator device 10 is a non-reciprocal device. Thus, in general, transmitted signals traveling in one direction through the device will be affected differently from signals traveling in the opposite direction through the device. The device 10 may be used to form an isolator by redirecting the parallel bias field vector $H_p$ to run in parallel with the direction of signal transmission through the device (longitudinal direction). Thus, in the drawing, the vector $H_{pp}$ is directed into the plane of the drawing to run in parallel with the length L of the device 10. The resonant frequency produced by this vector can be determined from Equation (2). In this configuration, signals traveling in one direction through the device 10 can be phase modulated or phase and amplitude modulated by means of the applied voltage V while signal flow in the opposite direction will be blocked or substantially reduced.

Obviously, numerous (additional) modifications and variations of the present Invention are possible in light of the above teachings. It is therefore to be understood that within the scope of the appended claims, the Invention may be practiced otherwise than as specifically described herein.

What is claimed as new and desired to be secured by Letters Patent of the United States is:

1. A fin-line waveguide device for modulating an electromagnetic signal passing therethrough comprising:
   a waveguide including first and second channel members, said channel members longitudinally extending in the direction of signal progagation through said waveguide;
   a ferrite dielectric slab disposed in said waveguide between said first and second channel members to approximately longitudinally bisect said waveguide, said ferrite slab electrically separating said first and second channel members, said ferrite slab being oriented in a longitudinally extending plane parallel to the electric field lines of said electromagnetic signal passing through said waveguide;
   means for producing a magnetic field in said ferrite slab and for magnetically biasing said ferrite slab to approximately ferromagnetic resonance; and
   means coupled to said ferrite slab for applying a voltage across said ferrite slab and for altering the ferromagnetic resonance characteristics of said ferrite slab in response to said voltage;
   wherein the phase angle of said signal passing through said waveguide is modulated in response to said voltage.

2. The fin-line waveguide device as recited in claim 1, wherein said ferrite slab includes:
   first and second longitudinally extending side surfaces, said first side surface being partially coated with a first metallic layer, said first metallic layer being in electrical contact with said first channel member, said second side surface being partially coated with a second metallic layer, said second metallic layer being in electrical contact with said second channel member.

3. The fin-line waveguide device as recited in claim 2, wherein:
   said first and second metallic layers each have thicknesses greater than the skin depth penetrated by said electromagnetic signal passing through said device.

4. The fin-line waveguide device as recited in claim 1, wherein:
   said ferrite slab is formed of a ferrite material exhibiting magnetoelectric characteristics.

5. The fin-line waveguide device as recited in claim 1, wherein:
   said ferrite slab is formed of lithium ferrite material.

6. The fin-line waveguide device as recited in claim 5, wherein:
   said ferrite slab is formed from a layer cut from the skin region of a bulk of single crystal lithium ferrite material, said bulk of lithium ferrite material being flux grown from lead rich melt.

7. The fin-line waveguide device as recited in claim 1, wherein:

the magnetizing force vector $H_T$ of said magnetic field is oriented perpendicular to the plane of said ferrite slab.

8. The fin-line waveguide device as recited in claim 7, wherein:

the ferromagnetic resonant frequency $\omega$ of said ferrite slab is related to the magnitude of the magnetizing force vector $H_T$ by:

$$\omega = \gamma[H_T - 4\pi M]$$

where:

$\gamma = ge/2mc$;
g is the gyromagnetic splitting factor;
e is the electron charge;
m is the electron mass;
c is the speed of light; and
M is the saturation magnetization of said ferrite slab.

9. The fin-line waveguide device as recited in claim 1, wherein:

the magnetizing force vector $H_p$ of said magnetic field is oriented parallel to the plane of said ferrite slab.

10. The fin-line waveguide device as recited in claim 9, wherein:

the ferromagnetic resonant frequency $\omega$ of said ferrite slab is related to the magnitude of the magnetizing force vector $H_p$ by:

$$\omega = \gamma[H_p(H_p + 4\pi M)]^{\frac{1}{2}}$$

where:

$\gamma = ge/2mc$;
g is the gyromagnetic splitting factor;
e is the electron charge;
m is the electron mass;
c is the speed of light; and
M is the saturation magnetization of said ferrite slab.

11. The fin-line waveguide device as recited in claim 1, wherein:

said magnetic field magnetically biases said ferrite slab to ferromagnetic resonance at a ferromagnetic resonant frequency, said ferromagnetic resonant frequency being equal to the frequency of said electromagnetic signal passing through said device, said device modulating the phase angle and the amplitude of said signal in response to said voltage.

12. The fin-line waveguide device as recited in claim 1, wherein:

said magnetic field magnetically biases said ferrite slab to a ferromagnetic resonant frequency, said ferromagnetic resonant frequency differing from the frequency of said electromagnetic signal passing through said device by a frequency equal to approximately ten times the absorption bandwidth of said ferrite slab, said device modulating the phase angle of said signal in response to said voltage.

13. A method of making a fin-line waveguide device for modulating an electromagnetic signal passing therethrough comprising the steps of:

providing a fin-line waveguide including first and second channel members longitudinally extending in the direction of signal propogation through said waveguide, said first and second channel members being physically and electrically separated by a longitudinally extending ferrite dielectric slab, said ferrite slab being directed in a longitudinally extending plane parallel to the electric field lines of said electromagnetic signal passing through said waveguide;

applying a magnetic field to said ferrite slab to magnetically bias said ferrite slab to approximately ferromagnetic resonance; and applying a voltage across said ferrite slab to alter the ferromagnetic resonance characteristics of said ferrite slab in response to said voltage;

wherein the phase angle of said signal passing through said waveguide is modulated in response to said voltage.

14. The method as recited claim 13, wherein said step of providing said fin-line waveguide further comprises the step of:

forming said ferrite slab from a ferrite material exhibiting magnetoelectric characteristics.

15. The method as recited in claim 13, wherein said step of providing said fin-line waveguide further comprises the step of:

forming said ferrite slab from lithium ferrite material.

16. The method as recited in claim 15, wherein said step of forming said ferrite slab comprises the steps of:

providing a bulk of single crystal lithium ferrite material, said bulk of lithium ferrite material being flux grown from lead rich melt;

cutting a layer from the skin region of said slab of material; and forming said ferrite slab from said layer.

17. The method as recited in claim 13, wherein said step of applying said magnetic field to said ferrite slab further comprises the step of:

adjusting the field strength of said magnetic field to magnetically bias said ferrite slab to ferromagnetic resonance at a ferromagnetic resonant frequency equal to the frequency of said electromagnetic signal passing through said waveguide, said device modulating the phase angle and the amplitude of said signal in response to said voltage.

18. The method as recited claim 13, wherein said step of applying said magnetic field to said ferrite slab further comprises the step of:

adjusting the field strength of said magnetic field to magnetically bias said ferrite slab to a ferromagnetic resonant frequency differing from the frequency of said electromagnetic signal passing through said waveguide by approximately ten times the absorption bandwidth of said ferrite slab, said device modulating the phase angle of said signal in response to said voltage.

* * * * *